US005905637A

United States Patent [19]

Su

[11] Patent Number: 5,905,637

[45] Date of Patent: May 18, 1999

[54] MODULE PLUG HAVING CIRCUIT BOARD WITH MOUNTING TERMINALS

[75] Inventor: Gorden Su, Taipei, Taiwan

[73] Assignee: Hsing Chau Industrial Co., Ltd., Taipei, Taiwan

[21] Appl. No.: 09/044,074

[22] Filed: Mar. 19, 1998

[51] Int. Cl.[6] .............................. H05K 5/00; H01R 23/02

[52] U.S. Cl. ........................... 361/752; 361/736; 439/676

[58] Field of Search ..................................... 361/728, 736, 361/759, 823, 828; 174/50, 250; 439/62, 374, 676, 344

[56] References Cited

U.S. PATENT DOCUMENTS 4,975,078 12/1990 Stroede et al. .......................... 439/405
4,990,102 2/1991 Myers ..................................... 439/452
5,312,273 5/1994 Andre et al. ............................ 439/607
5,505,638 4/1996 Su et al. ................................. 439/676
5,624,274 4/1997 Lin ......................................... 439/417
5,727,966 3/1998 Alpert .................................... 439/418

*Primary Examiner*—Leo P. Picard
*Assistant Examiner*—Jayprakash N. Gandhi
*Attorney, Agent, or Firm*—Varndell Legal Group

[57] ABSTRACT

A module plug includes a circuit board mounted in a mounting space on a casing to hold a front terminal rack and a rear terminal rack and a plurality of terminals in terminal holes on the front terminal rack and the rear terminal rack, a top cover covered on the casing and fastened to the rear terminal rack to hold a signal line, permitting the electrical wires of the signal line to be respectively forced into contact with the terminals on the rear terminal rack, the circuit board being convenient for the installation of an interference prevention circuit to prevent the terminals from interfering with one another.

5 Claims, 7 Drawing Sheets

MODULE PLUG HAVING CIRCUIT BOARD WITH MOUNTING TERMINALS

BACKGROUND AND SUMMARY OF THE INVENTION

The present invention relates to a module plug for telecommunication, and more particularly to such a module plug which comprises a circuit board mounted in a mounting space on a casing to hold a front terminal rack and a rear terminal rack and a plurality of terminals in terminal holes on the front terminal rack and the rear terminal rack, a top cover covered on the casing and fastened to the rear terminal rack to hold a signal line, permitting the electrical wires of the signal line to be respectively forced into contact with the terminals on the rear terminal rack, the circuit board being convenient for the installation of an interference prevention circuit to prevent the terminals from interfering with one another.

FIGS. 1 and 2 show a module plug designed for connection to a module jack according to the prior art. The module plug is connected to a signal line, having a clip at the bottom for fastened to the module jack, and a plurality of terminals arranged in parallel slots at the front side for contact with respective terminals in the module jack. After the electrical wires of the signal line are, after removable of insulator, inserted into respective wire holes on the module plug, and then fastened to the terminals respectively. Because the bare conductors of the electrical wires have a certain length and arranged close to one another side by side, a terminal interference problem tends to occur during a data transmission more particularly to 100 MHZ high frequency data transmission. Furthermore, because the electrical wires are arranged in parallel, it is difficult to interchange the positions between the electric wires.

The present invention has been accomplished to provide a module plug which eliminates the aforesaid drawbacks. It is one object of the present invention to provide a module plug which can be conveniently installed with an interference prevention circuit to prevent signal transmission interference between the terminals. It is another object of the present invention to provide a module plug which allows the positions of the electrical wires of the signal line to be conveniently interchanged. According to one aspect of the present invention, the module plug comprises a casing, the casing having a clip for securing to a module jack, a plurality of insertion slots arranged in parallel at a front side thereof for receiving respective terminals in the module jack, and a mounting space defined behind the insertion slots; a circuit board mounted in the mounting space and secured to the casing, the circuit board comprising a plurality of front terminal holes, a plurality of rear terminal holes, and a plurality of mounting holes; a plurality of front terminals and a plurality of rear terminals respectively fastened to the front terminal holes and rear terminal holes on the circuit board, the front terminals being disposed in alignment with the insertion slots on the casing; a top cover is covered on the casing over the circuit board, the front terminals and the rear terminals, the top cover having a plurality of wire grooves at a bottom side thereof; a signal line is fastened to the top cover, the signal line having a plurality of electrical wires respectively fastened to wire grooves on the top cover and forced into contact with the rear terminals respectively. According to another aspect of the present invention, a front terminal rack and a rear terminal rack are respectively fastened to the circuit board to hold the front terminals and the rear terminals on the circuit board, the front terminal rack and the rear terminal rack each having a plurality of downward mounting rods respectively fastened to the mounting holes on the circuit board, a plurality of terminal holes which receive the front terminals and the rear terminals respectively, the terminals holes on the rear terminals rack being arranged in two parallel rows for holding the rear terminals in two parallel rows.

DETAILED DESCRIPTION OF THE PREFERRED EMBODIMENT

Figure 1:
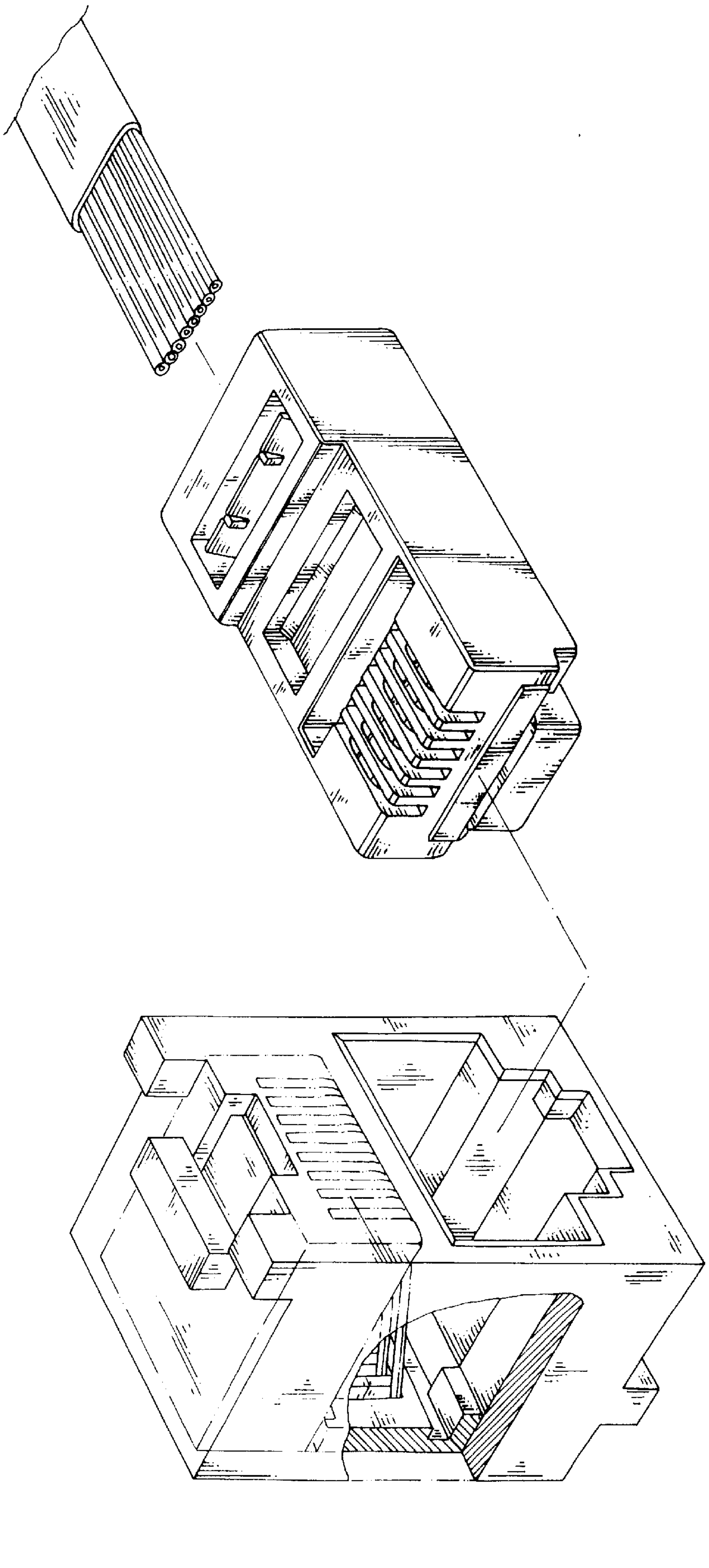
Fig. 1 PRIOR ART
FIG. 1 is an exploded view of a module jack and a module plug according to the prior art.
Figure 2:
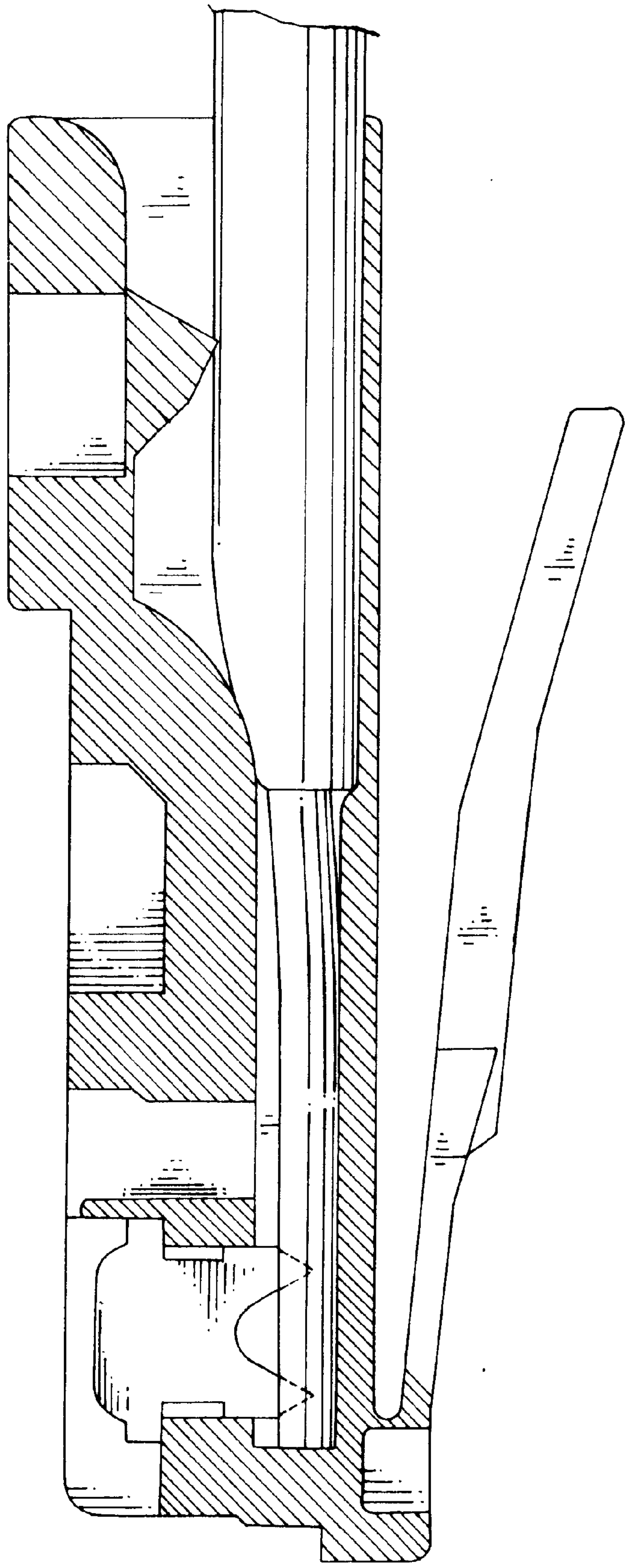
Fig. 2 PRIOR ART
FIG. 2 is a sectional showing the signal line fastened to the module plug according to the prior art.
Figure 3:
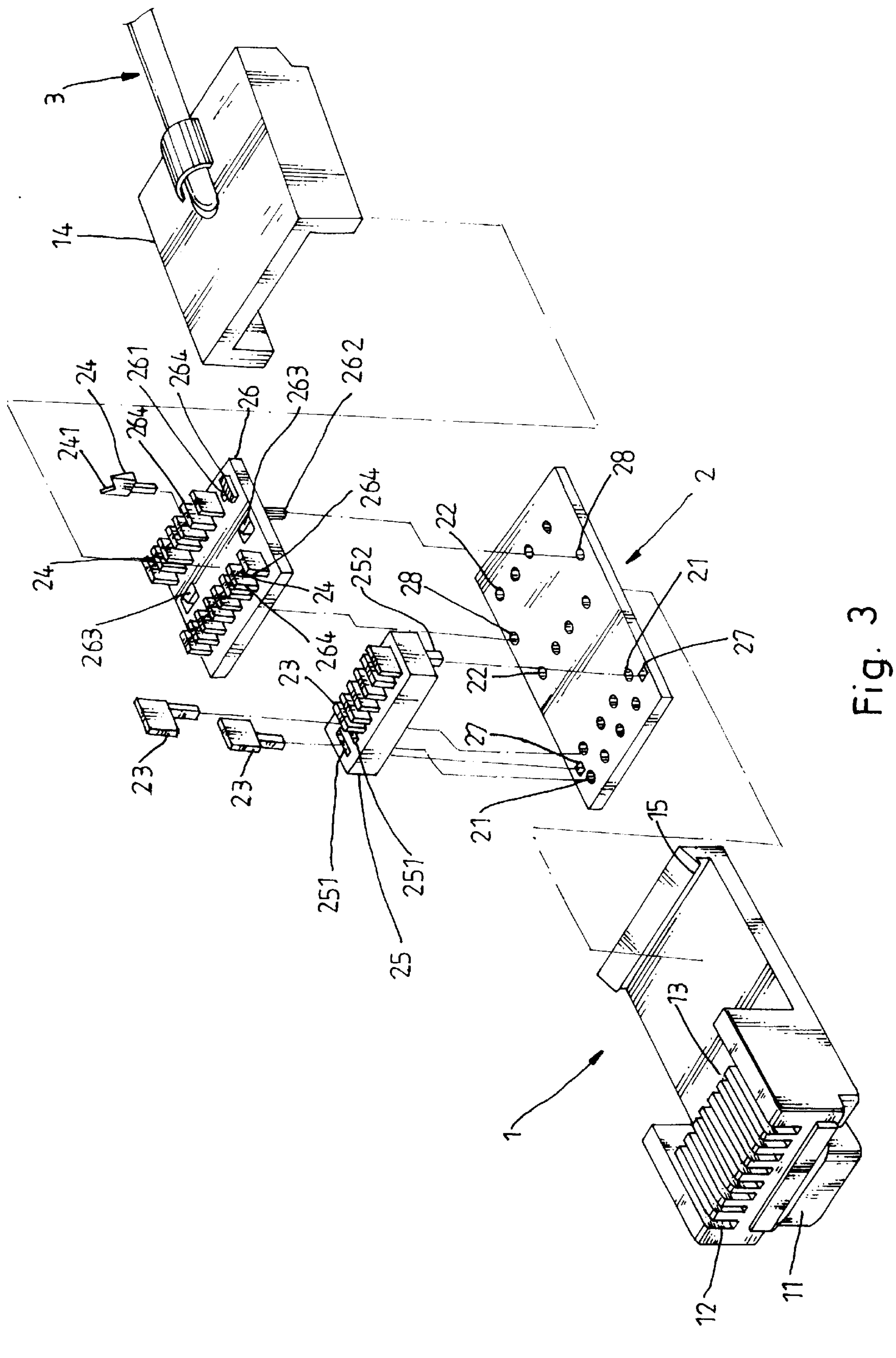
FIG. 3 is an exploded view of a module plug according to the present invention.

Referring to FIGS. from 3 to 7, a module plug accordance with the present invention is generally comprised of a casing 1, a circuit board 2, a top cover 14, and a signal line 3.

Figure 4:
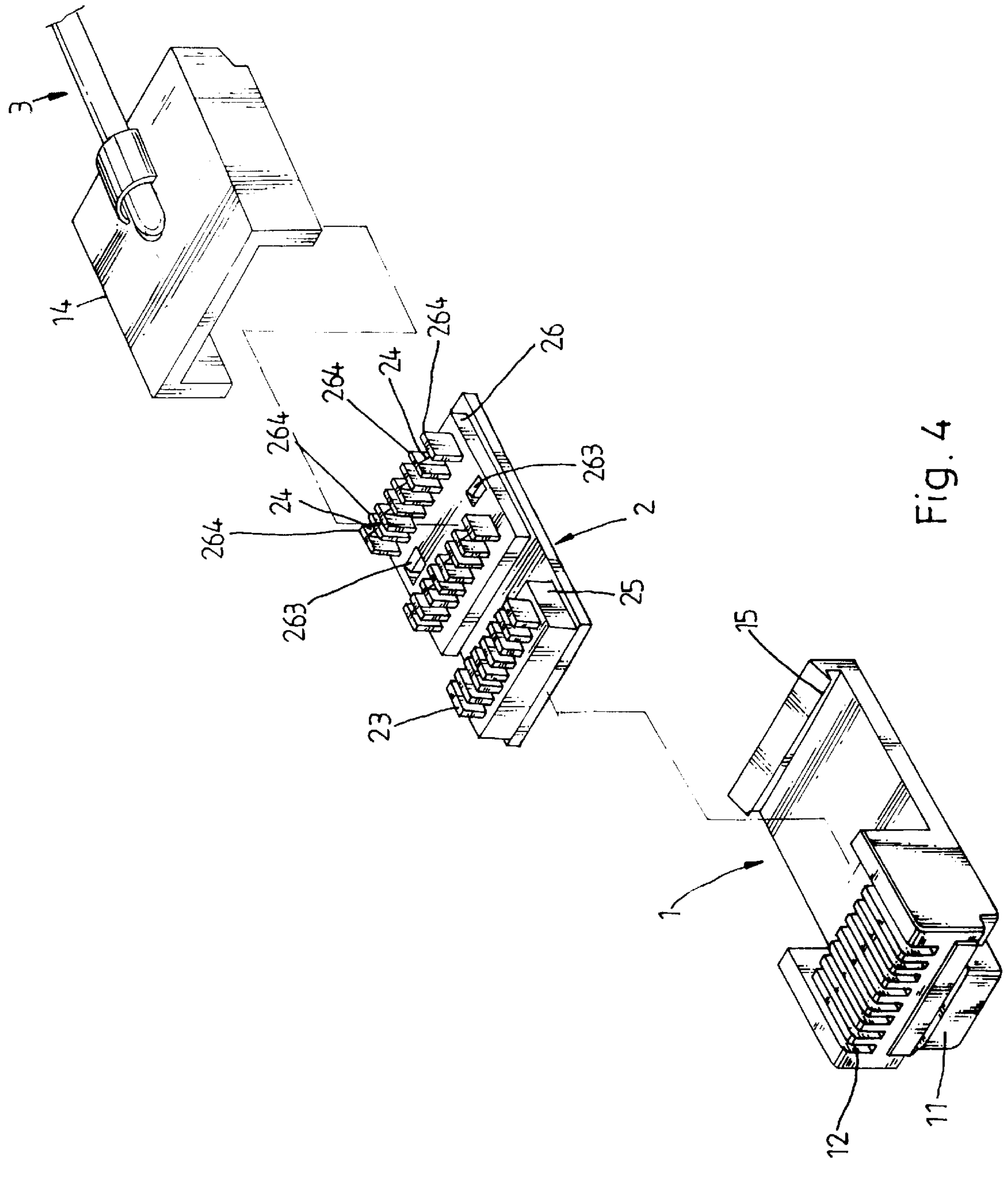
FIG. 4 is another exploded view of the present invention, showing the terminals, the terminal racks and the circuit board assembled.
Figure 5:
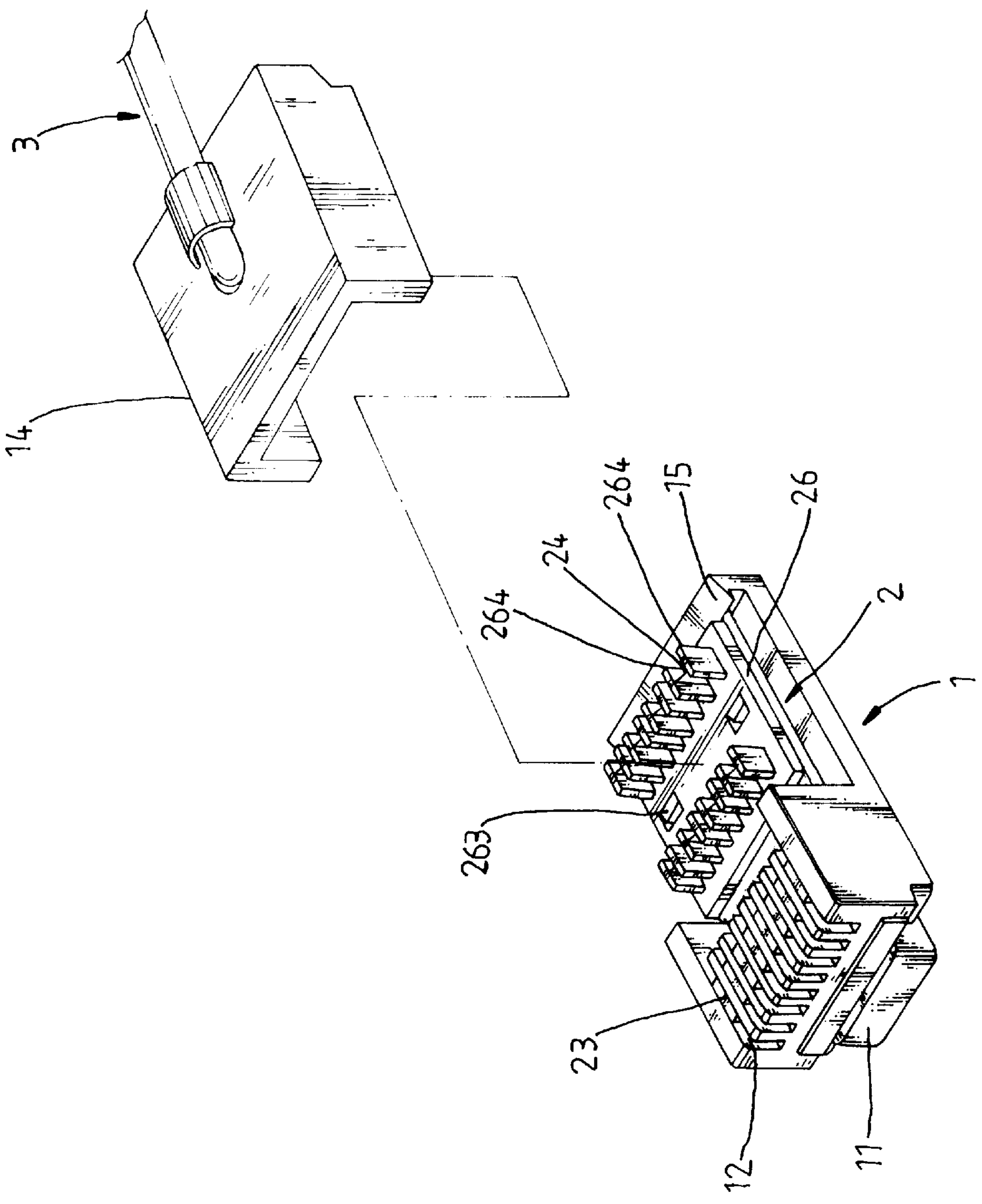
FIG. 5 is another exploded view of the present invention, showing the terminals, the terminal racks, the circuit board and the casing assembled.
Figure 6:
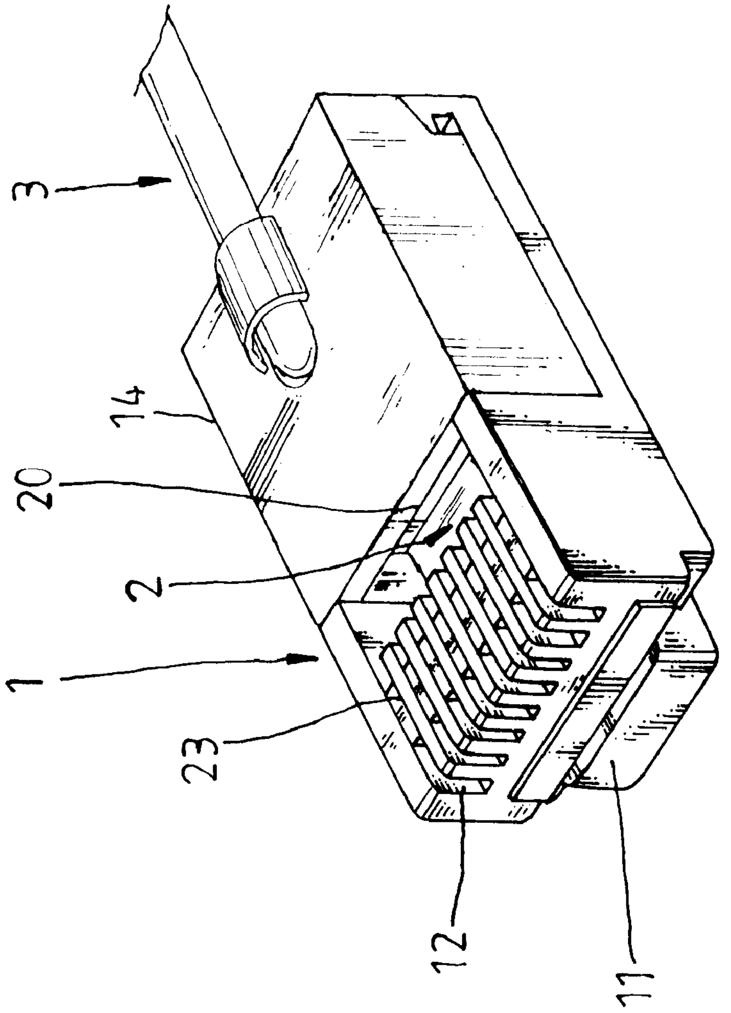
FIG. 6 is a perspective assembly view of the present invention.
Figure 7:
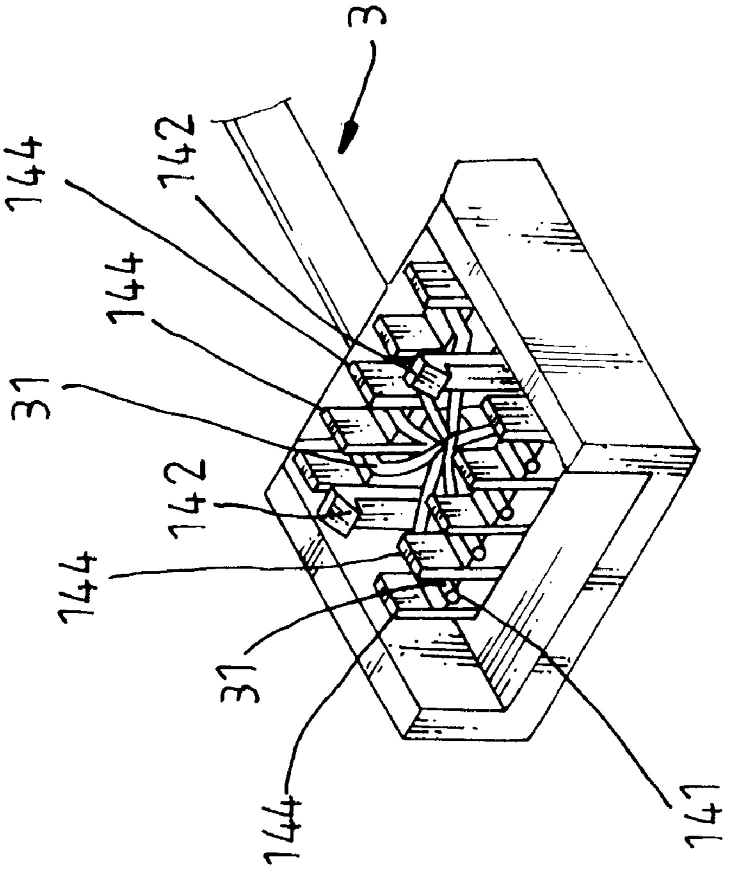
FIG. 7 is a perspective view of a part of the present invention, showing the bottom side structure of the top cover and the arrangement of the electrical wires of the signal line in the wire grooves on the top cover.

The casing 1 comprises a clip 11 which is integral with the bottom side of the casing 1 for securing the module plug to a module jack (not shown), a plurality of parallel insertion slots 12 at its front side, a mounting space 13 defined at its top side behind the slots 12 for receiving the circuit board 2, and a transverse coupling flange 15 at its rear side for holding the circuit board 2 in the mounting space 13. The circuit board 2 is mounted in the mounting space 13 and secured to the top side of the casing 1 by the coupling flange 15, having a plurality of front terminal holes 21 and rear terminal holes 22 and a plurality of mounting holes 27; 28. A front terminal rack 25 and a rear terminal rack 26 are respectively mounted on the circuit board 2. The front terminal rack 25 and the rear terminal rack 26 each have a plurality of terminal holes 251 or 261, and a plurality of downwardly extended mounting rods 252 or 262. By plugging the mounting rods 252; 262 into the mounting holes 27; 28 on the circuit board 2, the front terminal rack 25 and the rear terminal rack 26 are respectively fastened to the circuit board 2. A plurality of terminals 23; 24 are respectively mounted in the terminal holes 251; 261 on the terminal racks 25; 26 and fitted into the terminal holes 21; 22 on the circuit board 2. The terminal holes 22 on the circuit board 2 for the terminals 24 on the rear terminal rack 26 are arranged in two parallel rows. The rear terminal rack 26 further comprises a plurality of hook holes 263, and a plurality of partition flanges 264 raised from the top and respectively separated by the terminal holes 261. The terminals 24 which are mounted on the rear terminal rack 26 each have a sharp edge 241 at the top. After the terminals 23; 24 and the terminal racks 25; 26 have been installed in the circuit board 2 (see FIG. 4), a tin soldering procedure is performed to electrically connect the terminals 23; 24 and the circuit board 2 together, and then the circuit board 2 is fastened to the mounting space 13 in the casing 1 and secured in place by the coupling flange 15, permitting the terminals 23 on the front terminal rack 25 to be respectively disposed in alignment with the insertion slots 12 on the casing 1 for receiving the terminals in the module jack (see FIG. 5). The top cover 14 is covered on the casing 1 to hold down the terminal racks 25; 26 and the circuit board 2. The top cover 14 comprises a plurality of hooks 142 downwardly extended from its bottom side and respectively hooked in the hook holes 263 on the rear terminal rack 26, a plurality of upright partition strips 144 and a plurality of wire grooves 141 alternatively arranged in two rows at its bottom side (see FIG. 7). The signal line 3 is fixedly fastened to the top cover 14 at the top and inserted through a through hole (not shown) at the center of the top cover 14, having a plurality of electrical wires 31 respectively fastened to the wire grooves 141 on the top cover 14 and separated by the partition strips 144. After the top cover 14 has been fastened to the rear terminal rack 26 and covered on the casing 1 over the terminal racks 25; 26 and the circuit board 2, the sharp edges 241 of the terminals 24 on the rear terminal rack 26 are respectively forced into contact with conductors in the electrical wires 31, and the partition flanges 264 on the rear terminal rack 26 are respectively abutted against the partition strips 144 on the top cover 14.

As indicated above, the circuit board 2 is fastened to the mounting space 13 in the casing 1 and secured in place by the coupling flange 15, an interference prevention circuit can be conveniently installed in the circuit board 2 to eliminate the terminals from interfering with one another, so as to improve the signal transmission quality of the module plug. Because the wire grooves 141 on the top cover 14 are arranged in two rows corresponding to the terminals 24 on the rear terminal rack 26, the electrical wires 31 of the signal line 3 can be conveniently fastened to the wire grooves 141 subject to the desired arrangement.

While only one embodiment of the present invention has been shown and described, it will be understood that various modifications and changes could be made thereunto without departing from the spirit and scope of the invention disclosed.

I claim:

1. A module plug comprising a casing, said casing having a clip for securing to a module jack, a plurality of insertion slots arranged in parallel at a front side thereof for receiving respective terminals in said module jack, and a mounting space defined behind said insertion slots, wherein:

a circuit board is mounted in the mounting space and secured to said casing, said circuit board comprising a plurality of front terminal holes, a plurality of rear terminal holes, and a plurality of mounting holes;

a plurality of front terminals and a plurality of rear terminals are respectively fastened to the front terminal holes and rear terminal holes on said circuit board, said front terminals being disposed in alignment with the insertion slots on said casing;

a top cover is covered on said casing over said circuit board, said front terminals and said rear terminals, said top cover having a plurality of wire grooves at a bottom side thereof;

a signal line is fastened to said top cover, said signal line having a plurality of electrical wires respectively fastened to wire grooves on said top cover and forced into contact with said rear terminals respectively.

2. The module plug of claim 1, wherein said circuit board comprises a plurality of mounting holes; a front terminal rack and a rear terminal rack are respectively fastened to said circuit board to hold said front terminals and said rear terminals on said circuit board, said front terminal rack and said rear terminal rack each having a plurality of downward mounting rods respectively fastened to the mounting holes on said circuit board, a plurality of terminal holes which receive said front terminals and said rear terminals respectively.

3. The module plug of claim 1, wherein said casing comprises a coupling flange at a rear side thereof for holding down said circuit board in said mounting space.

4. The module plug of claim 1, wherein the rear terminal holes on said circuit board are arranged in two parallel rows; the terminal grooves on said top cover are arranged in two parallel rows corresponding to the rear terminal holes on said circuit board.

5. The module plug of claim 2, wherein said rear terminal rack comprises a plurality of hook holes, a plurality of partition of flanges which separate the terminal holes on said rear terminal rack from one another; said top cover comprises a plurality of downwards hooks respectively hooked in the hook holes on said rear terminal rack, and a plurality of partition strips which separate said wire grooves from one another and are respectively abutted against the partition flanges on said rear terminal rack; said rear terminals each have a sharp top edge respectively forced into contact with a respective conductor in said electrical wires of said signal line.

* * * * *